US007884486B2

(12) United States Patent
Pan et al.

(10) Patent No.: US 7,884,486 B2
(45) Date of Patent: Feb. 8, 2011

(54) CHIP-STACKED PACKAGE STRUCTURE AND METHOD FOR MANUFACTURING THE SAME

(75) Inventors: Yu-Tang Pan, Sinshih Township, Tainan County (TW); Shih-Wen Chou, Sinshih Township, Tainan County (TW)

(73) Assignee: Chipmos Technology Inc., Hsinchu (TW)

( * ) Notice: Subject to any disclaimer, the term of this patent is extended or adjusted under 35 U.S.C. 154(b) by 0 days.

(21) Appl. No.: 12/648,655

(22) Filed: Dec. 29, 2009

(65) Prior Publication Data

US 2010/0096741 A1    Apr. 22, 2010

Related U.S. Application Data

(62) Division of application No. 11/872,169, filed on Oct. 15, 2007, now abandoned.

(51) Int. Cl.
H01L 23/48 (2006.01)
H01L 23/52 (2006.01)
H01L 29/40 (2006.01)

(52) U.S. Cl. .............................. 257/777; 257/E23.022

(58) Field of Classification Search ................. 257/777, 257/778, E23.022
See application file for complete search history.

(56) References Cited

U.S. PATENT DOCUMENTS

| 6,452,279 | B2 | 9/2002 | Shimoda | |
| 6,531,337 | B1 * | 3/2003 | Akram et al. | 438/108 |
| 6,538,210 | B2 * | 3/2003 | Sugaya et al. | 174/258 |
| 7,640,655 | B2 * | 1/2010 | Sunohara | 29/832 |
| 2002/0190391 | A1 | 12/2002 | Ichikawa | |
| 2003/0141583 | A1 | 7/2003 | Yang | |
| 2004/0124539 | A1 | 7/2004 | Yang | |
| 2008/0265397 | A1 | 10/2008 | Lin | |

FOREIGN PATENT DOCUMENTS

CN           2524375          4/2002

* cited by examiner

*Primary Examiner*—David A Zarneke
*Assistant Examiner*—Jenny L Wagner
(74) *Attorney, Agent, or Firm*—Thomas, Kayden, Horstemeyer & Risley, LLP

(57) ABSTRACT

A chip stacked package structure and applications are provided. The chip-stacked package structure includes a main substrate, a baseboard substrate, and a molding compound. The main substrate has a substrate and a first chip. The substrate has a first surface and a second surface opposite to the first surface. The first chip is disposed on the first surface and electrically connected to the substrate via first bumps. The baseboard substrate has a third surface and a fourth surface faced towards the substrate. The baseboard substrate includes a core layer having a plurality of first through holes and a first accommodation space in which the first chip is received. The second chip is disposed on the third surface of the baseboard substrate. The molding compound is used to encapsulate the main substrate, and the baseboard substrate.

28 Claims, 12 Drawing Sheets

CHIP-STACKED PACKAGE STRUCTURE AND METHOD FOR MANUFACTURING THE SAME

RELATED APPLICATIONS

This application is a continuation-in-part of U.S. application Ser. No. 11/872,169, filed on Oct. 15, 2007, hereby incorporated by reference as it fully set forth herein.

BACKGROUND

1. Field of Invention

The present invention relates to a semiconductor package structure and the applications thereof, and more particularly relates to a chip stacked package structure and the method for manufacturing the same.

2. Description of Related Art

Nowadays, electronic devices are developed to provide increased functionality. Single chips with multiple integrated functions are therefore required to ensure and the chips can fit into electronic devices of limited. To integrate more functions in a single package, the package structure of the chip has evolved from a two-dimensions to three-dimensions and from a single-die package structure to a multiple-die package structure.

A system-in-package is a chip-stacked package structure with several chips with multiple functions integrated into a package structure, wherein these chips are stacked on a substrate by surface mount technology (SMT), so as to improve the packing process and to decrease the chip size. Whereby the system-in-package has the advantage of a small size, high operating frequency, high speed and low cost.

FIG. 5 illustrates a cross sectional view of a conventional chip stacked structure 500. The chip-stacked package structure 700 includes a substrate 510, a first chip 520, a second chip 530 and a plurality of bonding wires, such as bonding wires 540 and 550. The first chip 520 disposed on the substrate 510 is electrically connected to the substrate 510 by the bonding wire 540, and the second chip 530 stacked on the first chip 520 is electrically connected to the substrate 510 by the bonding wire 550.

To accommodate the arrangement of the bonding wire (the bonding wire 540) connected on the lower chip (the first chip 520); the size of the upper chip (the second chip 530 stacked on the first chip 520) must be smaller than that of the lower chip in the conventional design. Thus the design flexibility and the number of chips stacked in a single package are limited. Furthermore, it is necessary to extend the bonding wires in connecting the chips of small size with the substrate, whereby the radian of the bonding wires may be increased. Consequently, when a subsequent stamping process is conducted, the bonding wires may be wrenched off so as to make the electrical connection short and to decrease its manufacture yield.

To resolve the aforementioned problems, an alternative conventional chip stacked structure is provided. FIG. 6 illustrates a cross view cross-section view of an alternative conventional chip stacked structure 800. The chip-stacked package structure 600 includes a substrate 610, a first chip 620, a second chip 630, a plurality of bonding wires, such as bonding wires 640 and 650, and a dummy chip 660 disposed between the first chip 620 and the second chip 630. The first chip 620 disposed on the substrate 610 has a bonding pad 670 electrically connected to the substrate 610 by the bonding wire 640, and the dummy chip 660 is stacked on the first chip 620. The second chip 630 stacked on the dummy chip 660 has a bonding pad 680 electrically connected to the substrate 610 by the bonding wire 650. Since the size of the dummy chip is smaller than the size of the first chip 620 and the second chip 630, there provides enough wiring space between the lower chip (the first chip 620) and the upper chip (the second chip 630) for the bonding wire 640 to electrically bond on the lower chip. Accordingly, in this case the size of the upper chip (the second chip 630) is no longer limited.

However, using the dummy can increase the thickness of the pancake structure and may conflict with the trend of package size minimization. Therefore, it is desirable to provide an advanced chip-stacked package structure designed to improve the process yield so as to lower the manufacturing costs.

SUMMARY

One aspect of the present invention is to provide a chip-stacked package structure. The chip-stacked package structure includes a main substrate, a baseboard substrate, and a molding compound. The main substrate has a substrate and a first chip. The substrate has a first surface and a second surface opposite to the first surface. The substrate has at least one first bonding pad with at least one first solder thereon and at least one second bonding pad with at least one second solder thereon. The first bonding pad and the second bonding pad are formed in the first surface of the substrate. The first chip is disposed on the first surface. The first chip has a first active surface, a first rear surface, and a plurality of first bumps disposed on the first active surface. The first active surface faces towards the first surface of the substrate, and the first chip is electrically connected to the substrate via the first bumps. The baseboard substrate has a third surface and a fourth surface. The fourth surface faces towards the substrate. The baseboard substrate includes a core layer, at least one patterned circuit layer, a solder mask, a first via plug, a second via plug, and a second chip. The core layer has a plurality of first through holes and a first accommodation space in which the first chip is received, the first via plug and the second via plug are disposed in the first through holes. The at least one patterned circuit layer is disposed onto the core layer and electrically connected to the first via plug and the second via plug. The solder mask is disposed on the at least one patterned circuit layer and has an opening and a plurality of second through holes thereon. The second through holes exposes a portion of the at least one patterned circuit layer, and a third bonding pad and a fourth bonding pad are disposed in the second through holes and electrically connected to the at least one patterned circuit layer. The first chip is bonded to the substrate and utilizing an underfill material to seal the first bumps. The second chip is disposed on the third surface of the baseboard substrate. The molding compound is used to encapsulate the main substrate and the baseboard substrate.

Another aspect of the present invention is to provide a chip-stacked package structure. The chip-stacked package structure includes a main substrate, a plurality of baseboard substrates, and a molding compound. The main substrate has a substrate and a first chip. The substrate has a first surface and a second surface opposite to the first surface. The substrate has at least one first bonding pad with at least one first solder thereon and at least one second bonding pad with at least one second solder thereon. The first bonding pad and the second bonding pad are formed in the first surface of the substrate. The first chip is disposed on the first surface. The first chip has a first active surface, a first rear surface, and a plurality of first bumps disposed on the first active surface. The first active surface faces towards the first surface of the substrate, and the first chip is electrically connected to the substrate via the first bumps. Each of the baseboard substrate includes a core layer, at least one patterned circuit layer, a solder mask, a first via plug, a second via plug, and a second chip. The core layer has a plurality of first through holes and a first accommodation space for receiving a chip, the first via plug and the second via plug are disposed in the first through holes. The at least one patterned circuit layer is disposed onto the core layer and electrically connected to the first via plug and the second via plug. The solder mask is disposed on the at least one patterned circuit layer and has an opening and a plurality of second through holes thereon. The second through holes exposes a portion of the at least one patterned circuit layer, and a third bonding pad and a fourth bonding pad are disposed in the second through holes and electrically connected to the at least one patterned circuit layer. The baseboard substrates are stacked on one another, and electrically connected with one another, and the first accommodation space of the lowest one of the baseboard substrate is used to receive the first chip. The first chip is bonded to the substrate and utilizing an underfill material to seal the first bumps. The molding compound is used to encapsulate the main substrate and the baseboard substrates.

Another aspect of the present invention is to provide a method for manufacturing a chip-stacked package structure. The method includes steps as following. First, a main substrate is provided. The main substrate has a substrate, and a first chip. The substrate has a first surface and a second surface opposite to the first surface. The substrate has at least one first bonding pad with at least one first solder thereon and at least one second bonding pad with at least one second solder thereon. The first bonding pad and the second bonding pad are formed in the first surface of the substrate. The first chip is disposed on the first surface. The first chip has a first active surface, a first rear surface, and a plurality of first bumps disposed on the first active surface. The first active surface faces towards the first surface of the substrate, and the first chip is electrically connected to the substrate via the first bumps. The baseboard substrate has a third surface and a fourth surface. The fourth surface faces towards the substrate. Subsequently, a baseboard substrate is provided. The baseboard substrate has a third surface and a fourth surface. The baseboard substrate includes a core layer, at least one patterned circuit layer, a solder mask, a first via plug and a second via plug. The core layer has a plurality of first through holes and a first accommodation space in which the first chip is received, the first via plug and the second via plug are disposed in the first through holes. The at least one patterned circuit layer is disposed onto the core layer and electrically connected to the first via plug and the second via plug. The solder mask is disposed on the patterned circuit layer and has an opening and at least one second through holes thereon. The second through holes exposes a portion of the at least one patterned circuit layer, and the third bonding pad and the fourth bonding pad are disposed in the second through holes and electrically connected to the first patterned circuit layer. The second chip is disposed on the third surface of the baseboard substrate. For stacking the baseboard substrate on the main substrate, an adhesive is applying between the at least one patterned circuit layer of the baseboard substrate and the first rear surface of the first chip. After that, a molding compound is used to encapsulate main substrate and the baseboard substrate.

In accordance with above descriptions, the features of the present invention are providing a patterned circuit layer disposed on a rear surface of a lower chip in a chip-stacked package structure, wherein the patterned circuit layer has at least one finger (or through hole) electrically connected to at least one bonding pad (or solder) disposed on the upper chip that is stacked thereon. Accordingly, it is not necessary to extend the length and the radian of the bonding wire in connecting the upper chips with the substrate or to reduce the size of the upper chip for involving more chips in a single package, so as to solve the prior problems in the art. Also, since the lengths of wires are reduced, the disadvantage of wire sweep also can be improved.

By means of stacking the chips on the substrate with via plug instead of bonding wires for electrically connecting the chips to the substrate in the chip-stacked package structure, the embodiments of the present invention have the advantage of enhancing the heat radiation, improving the electrical connection between the substrate and the chips, and reducing the whole volume of the chip-stacked package structure.

It is to be understood that both the foregoing general description and the following detailed description are by examples, and are intended to provide further explanation of the invention as claimed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The foregoing aspects and many of the attendant advantages of this invention will become more readily appreciated as the same becomes better understood by reference to the following preferred embodiments of chip-stacked package structures.

Figure 1:
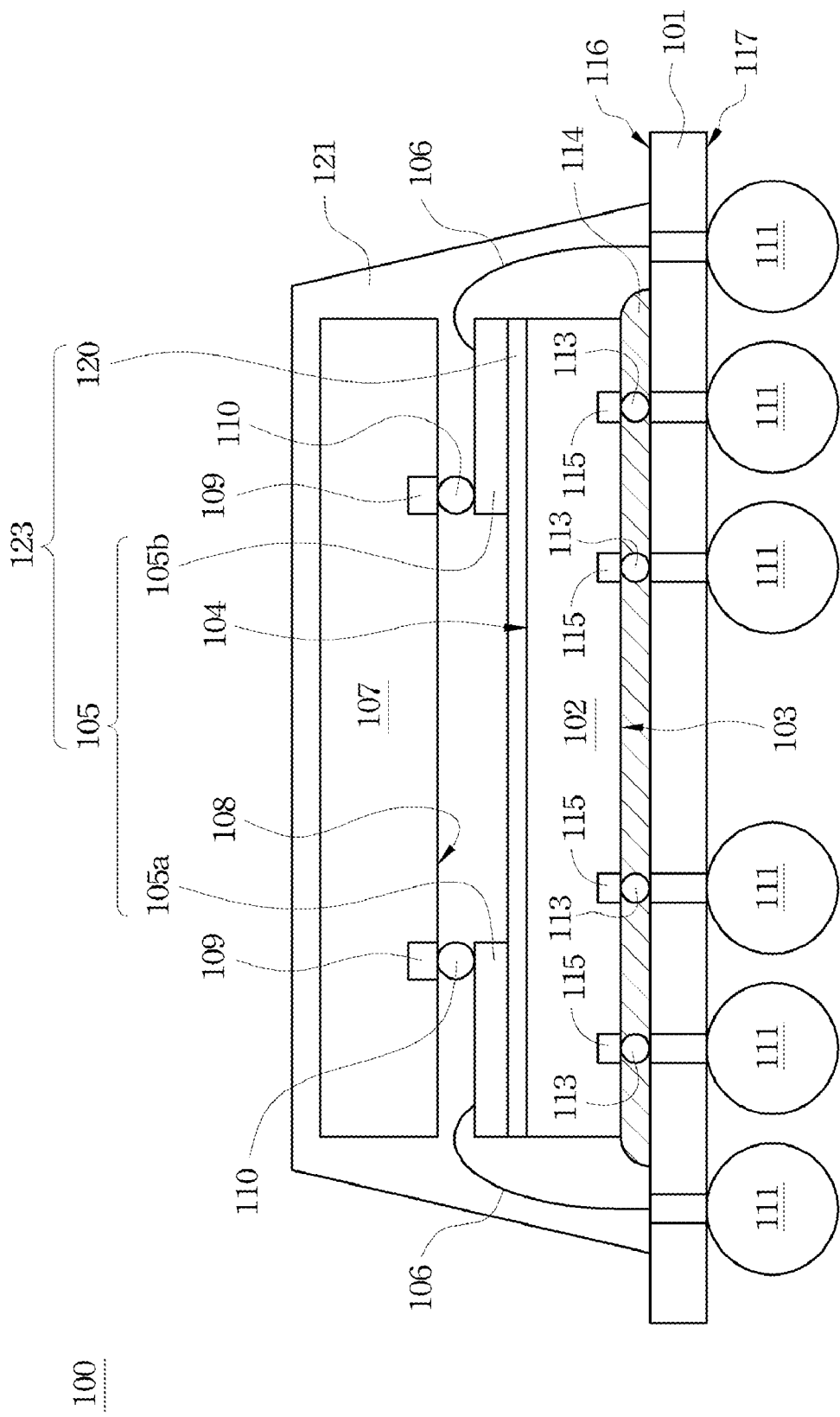
FIG. 1 illustrates a cross section view of a chip-stacked package structure 100 in accordance with a first preferred embodiment of the present invention.

FIG. 1 illustrates a cross section view of a chip-stacked package structure 100 in accordance with a first preferred embodiment of the present invention.

The chip-stacked package structure 100 includes a substrate 101, a first chip 102, a circuit board 123, a second chip 107 and a molding compound 120.

The chip-stacked package structure 100 is formed by following steps. First, the substrate 101 having a first surface 116 and a second surface 117 opposite to the first surface 116 is provided. In some preferred embodiments of the present invention, the substrate 101 can be a lead frame, a printed circuit board or a die carrier. In the present embodiment, the substrate 101 is a printed circuit board made of FR4 or BT epoxy, or made of the materials that constitute a flexible printed circuit board.

The first chip 102 having a first active surface 103 facing the first surface 116 of the substrate 101 and a first rear surface 104 opposite to the first active surface 103 is then mounted on the first surface 116 by a flip chip bonding process to electrically connect the first active surface 103 to the first surface 116 of the substrate 101. In the present embodiment, the first active surface 103 has a plurality of first bonding pads 115 electrically connected to the substrate 101 via a plurality of bumps 113. After the first chip 102 is stacked on the first surface 116 of the substrate 101, an underfill material 114 is used to encapsulate the bumps 113 and to fix the first chip 102 over the first surface 116 of the substrate 101.

Subsequently, the circuit board 123 is formed on the first rear surface 104 of the first chip 102, wherein the circuit board 123 includes a dielectric layer 120 disposed over the first rear surface 104 and a patterned circuit layer 105 formed on the dielectric layer 120, and the patterned circuit layer 105 is electrically connected to the substrate 101 by a boding wire 106. In the embodiments of the present invention, the patterned circuit layer 105 having a plurality of fingers, such as fingers 105a and 105b, is a redistribution layer. One end of each finger (for example 105a) is electrically connected to one of the second bonding pads 109 disposed on the second chip 107 that is subsequently stacked on the patterned circuit layer 105, and the other end of the finger extends towards another area of the first rear surface 104 apart from the second bonding pads 109. For example, the other end of the finger extends towards the edge of the first rear surface 104.

Referring to FIG. 1, the bonding wire 106 is bonded to the patterned circuit layer 105 at a location directly below the second chip 107. The dielectric layer 120 of the circuit board 123 is directly formed on and contacted with the first rear surface 104. As shown in FIG. 1, the circuit board 123 has a size substantially identical to the size of the first chip 102. However, in other embodiments of the present invention, the circuit board provided on the first chip may have a size smaller than the size of the first chip.

Then, the second chip 107 is stacked on the patterned circuit layer 105 by a flip chip process, wherein the second chip 107 has a second active surface 108 having a plurality of second bonding pads 109 disposed thereon. Each of the second bonding pads 109 is electrically connected to one of the fingers (105a or 105b) of the patterned circuit layer 105. In the embodiments of the present application, the pattern contributed by the fingers (105a or 105b) of the patterned circuit layer 105 can altered in corresponding to the various arrangements of the boding pads 109 disposed on different types of the second chip 107.

After that, the molding compound 120 is then used to encapsulate the substrate 101, the first chip 102, the circuit board 123 and the second chip 107. A plurality of external connecting bumps 111, such as a plurality of solder bumps, are then formed on the second surface 117 of the substrate 101 used to connect the substrate 101 with at least one external electronic device (not shown).

Since one of the boding pads 109 of the second chip 107 is electrically connected to one of the fingers (such as finger 105a or finger 105b) of the patterned circuit layer 105, when the second chip 107 is stacked on the first chip 102 with a size identical to the size of the first chip 102, the fingers of the patterned circuit layer 105 can redistribute the arrangement of the second bonding pads 109 of the second chip 107, so as to shift the bonding area of the bonding pads 109 towards the edge of the second chip 107 for the bonding wire 106 to electrically connect the bonding pads 109 with the substrate 101. For another embodiment of the present application not drawing in the specification, the first rear surface 104 of the first chip 102 and the second active surface 108 of the second chip 107 can have different sizes.

Figure 2:
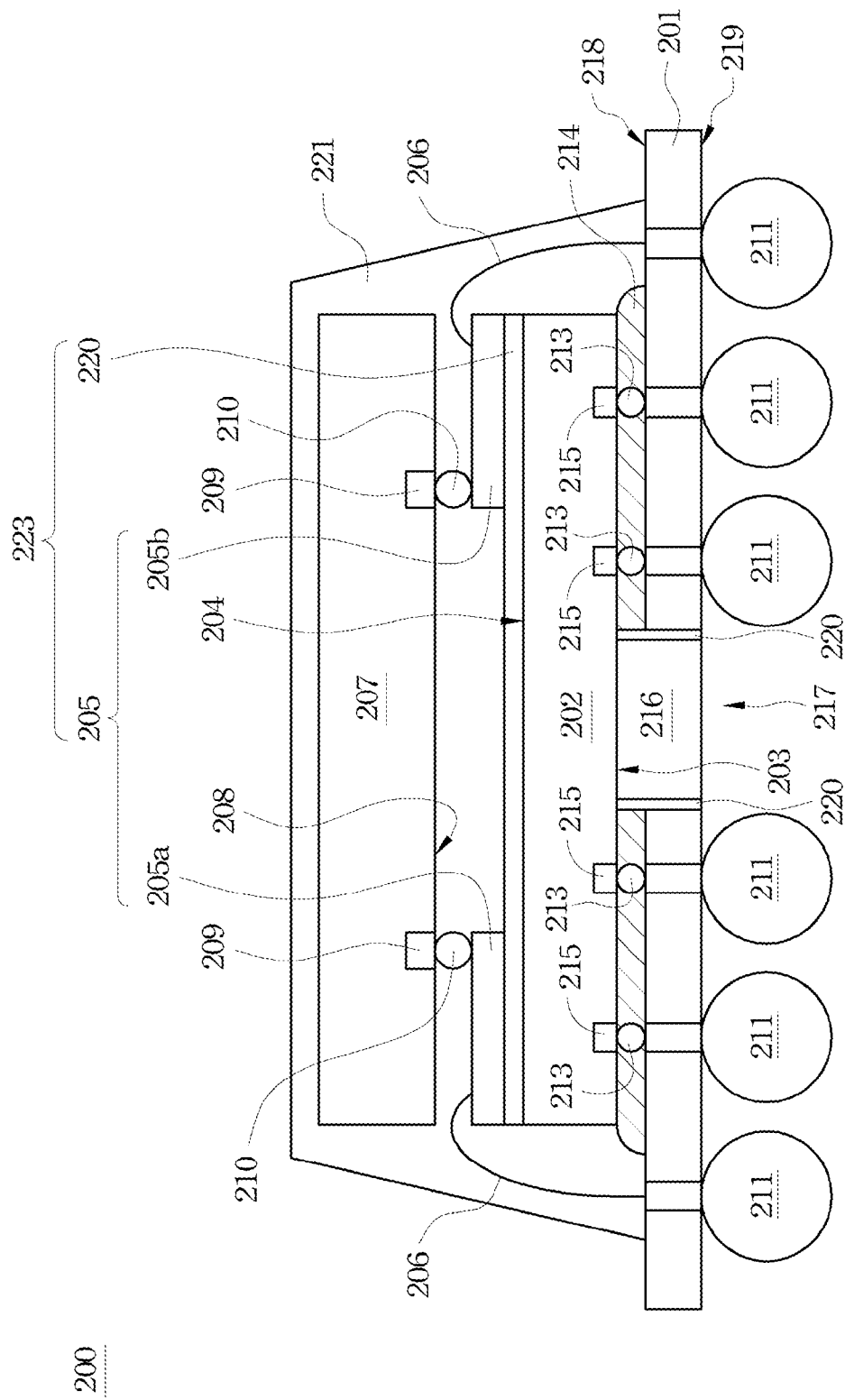
FIG. 2 illustrates a cross section view of a chip-stacked package structure 200 in accordance with a second preferred embodiment of the present invention.

FIG. 2 illustrates a cross section view of a chip-stacked package structure 200 in accordance with a second preferred embodiment of the present invention.

The chip-stacked package structure 200 includes a substrate 201, a first chip 202, a circuit board 223, a second chip 207 and a molding compound 220.

The chip-stacked package structure 200 is formed by the following steps: First, the substrate 201 having a first surface 218 and a second surface 219 opposite to the first surface 218 is provided. In some preferred embodiments of the present invention, the substrate 201 can be a lead frame, a printed circuit board or a die carrier. In the present embodiment, the substrate 201 is a printed circuit board made of FR4 or BT epoxy, or made of the materials that constitute a flexible printed circuit board.

Next a through hole 217 is formed to penetrate the substrate 201, and the first chip 202 having a first active surface 203 facing the first surface 218 of the substrate 201 and a first rear surface 204 opposite to the first active surface 203 is then mounted on the first surface 218 by a flip chip bonding process to electrically connect the first active surface 203 to the first surface 218 of the substrate 201. In the present embodiment, the first active surface 203 has a plurality of first bonding pads 215 electrically connected to the substrate 201 via a plurality of bumps 213. After the first chip 202 is stacked on the first surface 218 of the substrate 201, an underfill material 214 is used to encapsulate the bumps 213 and to fix the first chip 202 over the first surface 218 of the substrate 201.

Since a portion of the first active surface 203 can be exposed by the through hole 217 penetrates the substrate 201. In some preferred embodiment, a heat sink 216 can be extend outward the through hole 217 from the exposed portion of the first active surface 203 to enhance the heat distribution of the chip-stacked package structure 200.

Subsequently, the circuit board 223 is formed on the first rear surface 204 of the first chip 202, wherein the circuit board 223 includes a dielectric layer 220 disposed over the first rear surface 204 and a patterned circuit layer 205 formed on the dielectric layer 220, and the patterned circuit layer 205 is electrically connected to the substrate 201 by a boding wire 206. In the embodiments of the present invention, the patterned circuit layer 205 that has a plurality of fingers, such as fingers 205a and 205b, is a redistribution layer. One end of each finger (for example finger 205a) is used to electrically connected to one of a second bonding pad 209 disposed the second chip 207 that is subsequently stacked on the patterned circuit layer 205, and the other end of the finger 205a extends towards another area of the first rear surface 204 apart from the second bonding pad 209. For example, the other end of the finger 205a extends towards the edge of the first rear surface 204.

Then, the second chip 207 is stacked on the patterned circuit layer 205 by a flip chip process, wherein the second chip 207 has a second active surface 208 having a plurality of second bonding pads 209 disposed thereon. Each of the second bonding pads 209 is electrically connected to one of the fingers (205a or 205b) of the patterned circuit layer 205. In the embodiments of the present application, the pattern contributed by the fingers (205a or 205b) of the patterned circuit layer 205 can be altered to correspond to the various arrangements of the boding pads 209 disposed on different types of the second chip 207.

After that, a molding compound 220 is then used to encapsulate the substrate 201, the first chip 202, the circuit board 223 and the second chip 207. A plurality of external connecting bumps 211, such as a plurality of solder bumps, are then formed on the second surface 219 of the substrate 201 used to connect the substrate 201 with at least one external electronic device (not shown).

Since one of the boding pads 209 of the second chip 207 is electrically connected to one of the fingers (such as finger 205a or finger 205b) of the patterned layer 205, when the second chip 207 is stacked on the first chip 202 with a size identical to the size of the first chip 102, the fingers of the patterned circuit layer 205 can redistribute the arrangement of the second bonding pads 209 of the second chip 207, so as to shift the bonding area of the bonding pads 209 towards the edge of the second chip 207 for the bonding wire 206 to electrically connect the bonding pads 209 with the substrate 201. For another embodiment of the present application not drawing in the specification, the first rear surface 204 of the first chip 202 and the second active surface 208 of the second chip 207 can have different sizes.

Figure 3:
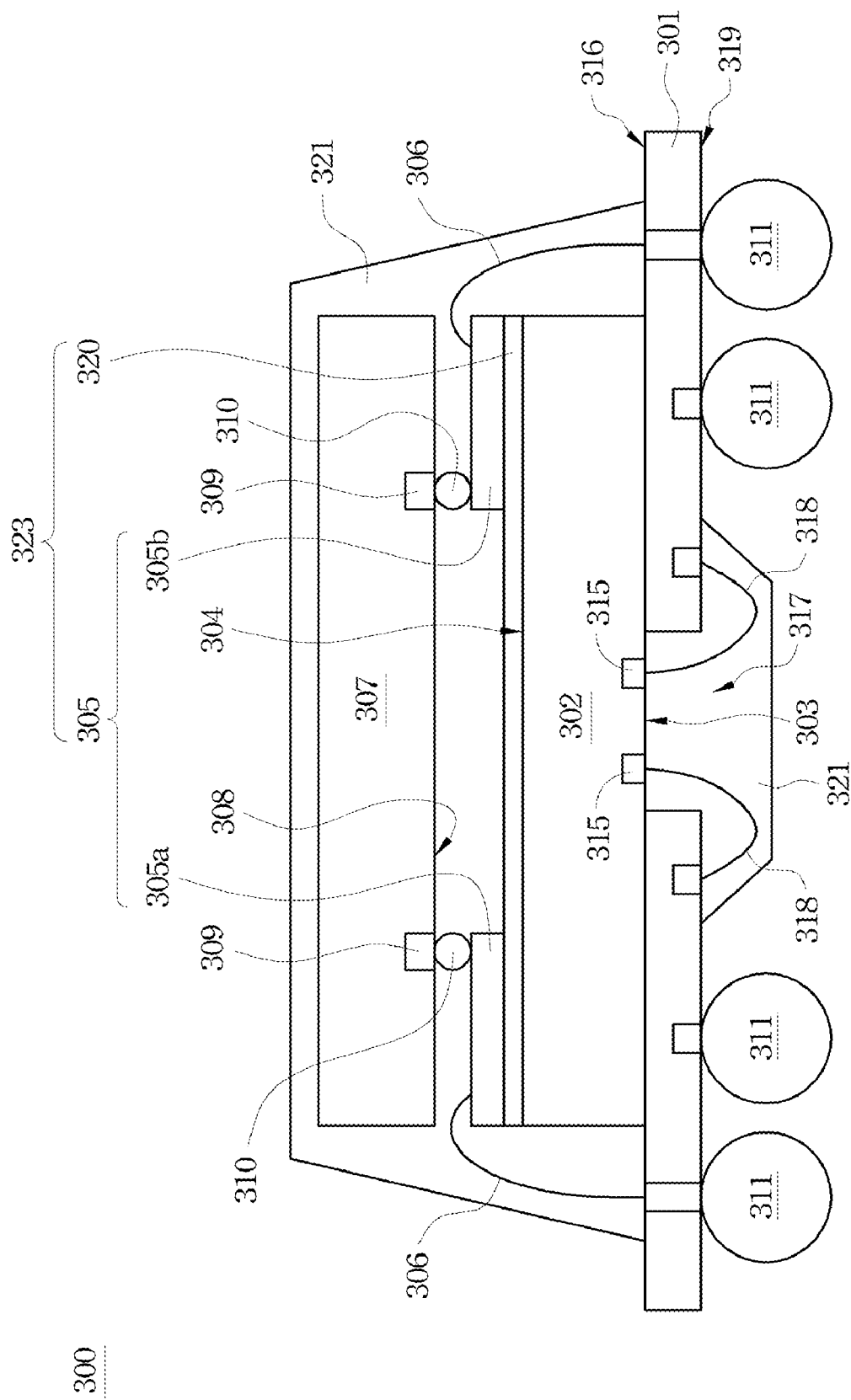
FIG. 3 illustrates a cross section view of a chip-stacked package structure 300 in accordance with a third preferred embodiment of the present invention.

FIG. 3 illustrates a cross section view of a chip-stacked package structure 300 in accordance with a third preferred embodiment of the present invention.

The chip-stacked package structure 300 includes a substrate 301, a first chip 302, a circuit board 323, a second chip 307 and a molding compound 320.

The chip-stacked package structure 300 is formed by the following steps: First, the substrate 301 having a first surface 316 and a second surface 319 opposite to the first surface 316 is provided. In some preferred embodiments of the present invention, the substrate 301 can be a lead frame, a printed circuit board or a die carrier. In the present embodiment, the substrate 301 is a printed circuit board made of FR4 or BT epoxy, or made of the materials that constitute a flexible printed circuit board.

Next, a through hole 317 is formed to penetrate the substrate 301, and the first chip 302 having a first active surface 303 facing the first surface 316 of the substrate 301 and a first rear surface 304 opposite to the first active surface 303 is then mounted on the first surface 316 by a flip chip bonding process to electrically connect the first active surface 303 to the substrate 301.

In the present embodiment, a portion of the first active surface 303 mounted on the first surface 316 of the substrate 301 is exposed by the through hole 317 penetrating through the substrate 301, and the first chip 302 has a plurality of first bonding pads 315 disposed on the exposure portion of the first active surface 303 electrically connected to the substrate 301 via a plurality of bonding wires 318 passing through the through hole 317.

Subsequently, the circuit board 323 is formed on the first rear surface 304 of the first chip 302, wherein the circuit board 323 includes a dielectric layer 320 disposed over the first rear surface 304 and a patterned circuit layer 305 formed on the dielectric layer 320, and the patterned circuit layer 305 is electrically connected to the substrate 301 by a boding wire 306. In the embodiments of the present invention, the patterned circuit layer 305 having a plurality of fingers, such as fingers 305a and 305b, is a redistribution layer. One end of each finger (for example finger 305a) is electrically connected to one of a second bonding pad 309 disposed on the second chip 307 that is subsequently stacked on the patterned circuit layer 305, and the other end of the finger 305a extends towards another area of the first rear surface 304 apart from the second bonding pad 309. For example, the other end of the finger 305a extends towards the edge of the first rear surface 304.

Then, the second chip 307 is stacked on the patterned circuit layer 305 by a flip chip process, wherein the second chip 307 has a second active surface 308 having a plurality of second bonding pads 309 disposed thereon. Each of the second bonding pads 309 is electrically connected to one of the fingers (305a or 305b) of the patterned circuit layer 305. In the embodiments of the present application, the pattern contributed by the fingers (305a or 305b) of the patterned circuit layer 305 can altered in corresponding to the various arrangements of the boding pads 309 disposed on different types of the second chip 307.

After that, a molding compound 320 is then used to encapsulate the substrate 301, the first chip 302, the circuit board 323 and the second chip 307. A plurality of external connecting bumps 311, such as a plurality of solder bumps, are then formed on the second surface 319 of the substrate 301 used to connect the substrate 301 with at least one external electronic device (not shown).

Since one of the boding pads 309 of the second chip 307 are electrically connected to one of the fingers (such as finger 305a or finger 305b) of the patterned circuit layer 305, when the second chip 307 is stacked on the first chip 302 with a size identical to the size of the first chip 302, the fingers of the patterned circuit layer 305 can redistribute the arrangement of the second bonding pads 309 of the second chip 307, so as to shift the bonding area of the bonding pads 309 towards the edge of the second chip 307 for the bonding wire 306 to electrically connect the bonding pads 209 with the substrate 301. For another embodiment of the present application not drawing in the specification, the first rear surface 304 of the first chip 302 and the second active surface 308 of the second chip 307 can have different sizes.

In other embodiments, the present invention also can be applicable to a flip-chip type of chip-stacked package structure instead of a wire bonding type of chip-stacked package structure described above.

Figure 4:
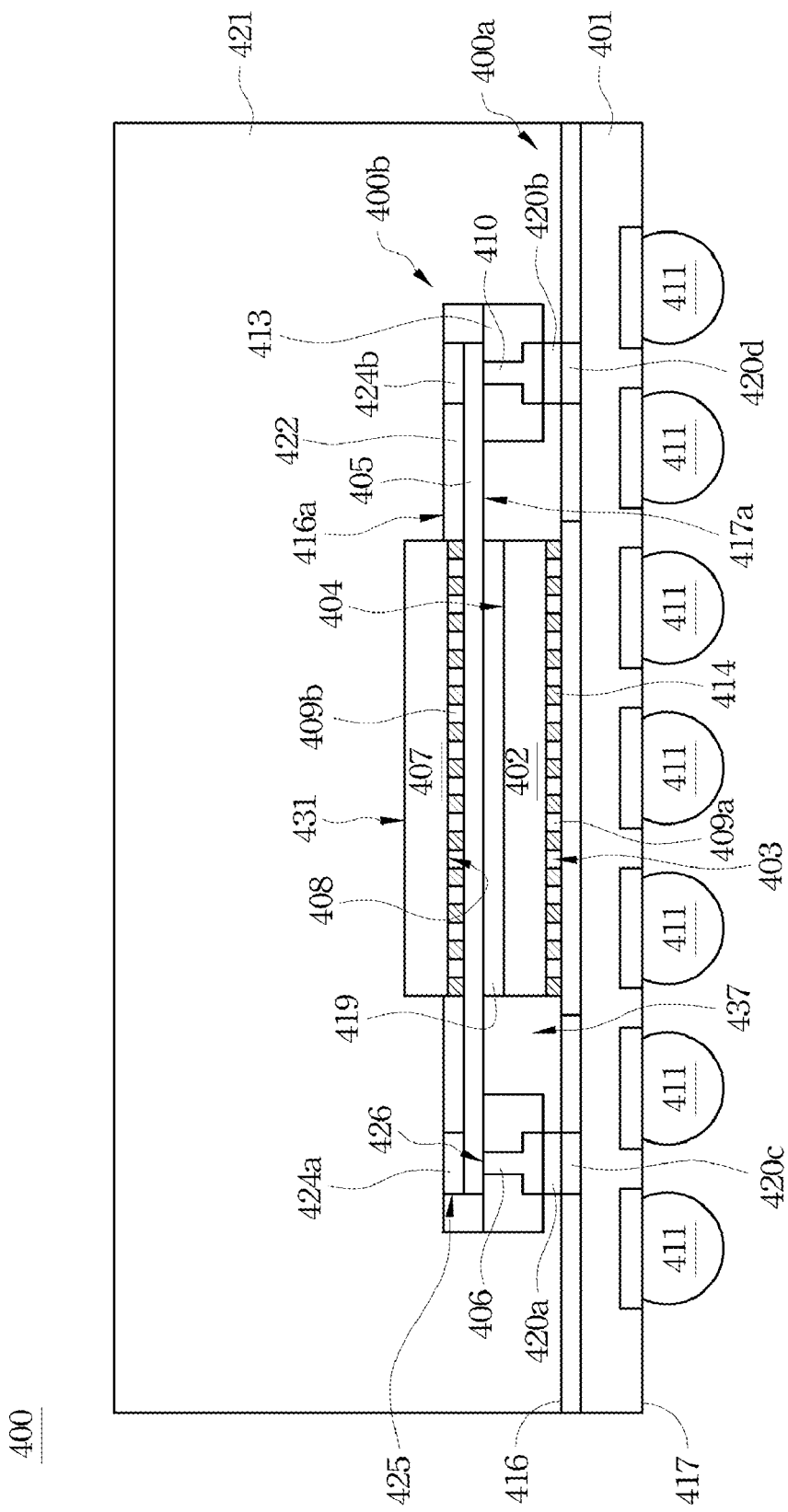
FIG. 4 illustrates a cross section view of a chip-stacked package structure 400 in accordance with a fourth preferred embodiment of the present invention.

Referring to FIG. 4, FIG. 4 illustrates a chip-stacked package structure 400 according to a fourth embodiment of the present invention. The chip-stacked package structure 400 includes a main substrate 400a, a first baseboard substrate 400b, and a molding compound 421. The main substrate 400a includes a substrate 401, and a first chip 402. The first baseboard substrate 400b has a third surface 416a and a fourth surface 417a. The fourth surface 417a faces towards the substrate 401.

The substrate 401 has a first surface 416 and a second surface 417 opposite to the first surface 416. The substrate 401 includes a first bonding pad 420c, a second bonding pad 420d. In some embodiments of the present invention, the substrate 401 can be a lead frame, a printed circuit board or a die carrier. In the present embodiment, the substrate 401 is a printed circuit board made of FR4 or BT epoxy, or made of the materials that constitute a flexible printed circuit board. The first bonding pad 420c and the second bonding pad 420d are formed in the first surface 416 of the substrate 401. In one embodiment, a first solder 420a and a second solder 420b are disposed on the first bonding pad 420c and the second bonding pad 420d, respectively.

The first chip 402 is disposed on the first surface 416. The first chip 402 has a first active surface 403, a first rear surface 404, and a plurality of first bumps 409a disposed on the first active surface 403. The first active surface 403 faces towards the first surface 416 of the substrate 401, and the first chip 402 is electrically connected to the substrate 401 via the first bumps 409a. The first chip 402 is bonded to the substrate 401 and utilizing an underfill material 414 to seal the first bumps 409a.

The first baseboard substrate 400b includes a first core layer 413, a first patterned circuit layer 405, a first solder mask 422, a first via plug 406, a second via plug 410, and a second chip 407. The first core layer 413 has a plurality of first through holes 426 and a first accommodation space 437, and the first via plug 406 and the second via plug 410 are disposed in the first through holes 426. The first patterned circuit layer 405 is disposed onto the first core layer 413 and electrically connected to the first via plug 406 and the second via plug 410. The first solder mask 422 is disposed on the first patterned circuit layer 405 and has an opening and a plurality of second through holes 425 thereon. The second through holes 425 exposes a portion of the first patterned circuit layer 405, and a third bonding pad 424a and a fourth bonding pad 424b are disposed in the second through holes 425 and electrically connected to the first patterned circuit layer 405. In one embodiment, the first via plug 406 and the second via plug 410 are made of an electrically conductive material, such as copper. The second chip 407 is disposed on the third surface 416a of the first baseboard 423. The second chip 407 has a second active surface 408, a second rear surface 431, and a plurality of second bumps 409b disposed on the second active surface 408. The second active surface 408 faces towards the third surface 416a of the first baseboard 423. The second chip 407 is mounted on the opening of the first solder mask 422 and electrically connected and bonded to the first patterned circuit layer 405 via the second bumps 409b. The second chip 407 is utilizing an underfill material 414 to seal the second bumps 409b.

The molding compound 421 is used to encapsulate the main substrate 400a, and the first baseboard substrate 400b. A plurality of terminals, such as a plurality of solder bumps 411, are formed on the second surface 417 of the substrate 101 used to electrically connect the substrate 401 with at least one external electronic device (not shown). In one embodiment, an adhesive 419 is disposed between the first patterned circuit layer 405 of the first baseboard 423 and the first rear surface 404 of the first chip 402.

Although FIG. 4 is shown and described as having certain numbers and types of elements, such as patterned circuit layers, via plugs or bonding pads, exemplary embodiments are not so limited; that is, other embodiments may include elements other than the ones shown, and may also include more than one of the elements that are shown. The person skilled in the art should be assumed to know that the patterned circuit layer 405 has a plurality of circuits (not shown) and electrical connection terminals (not shown).

Figure 5:
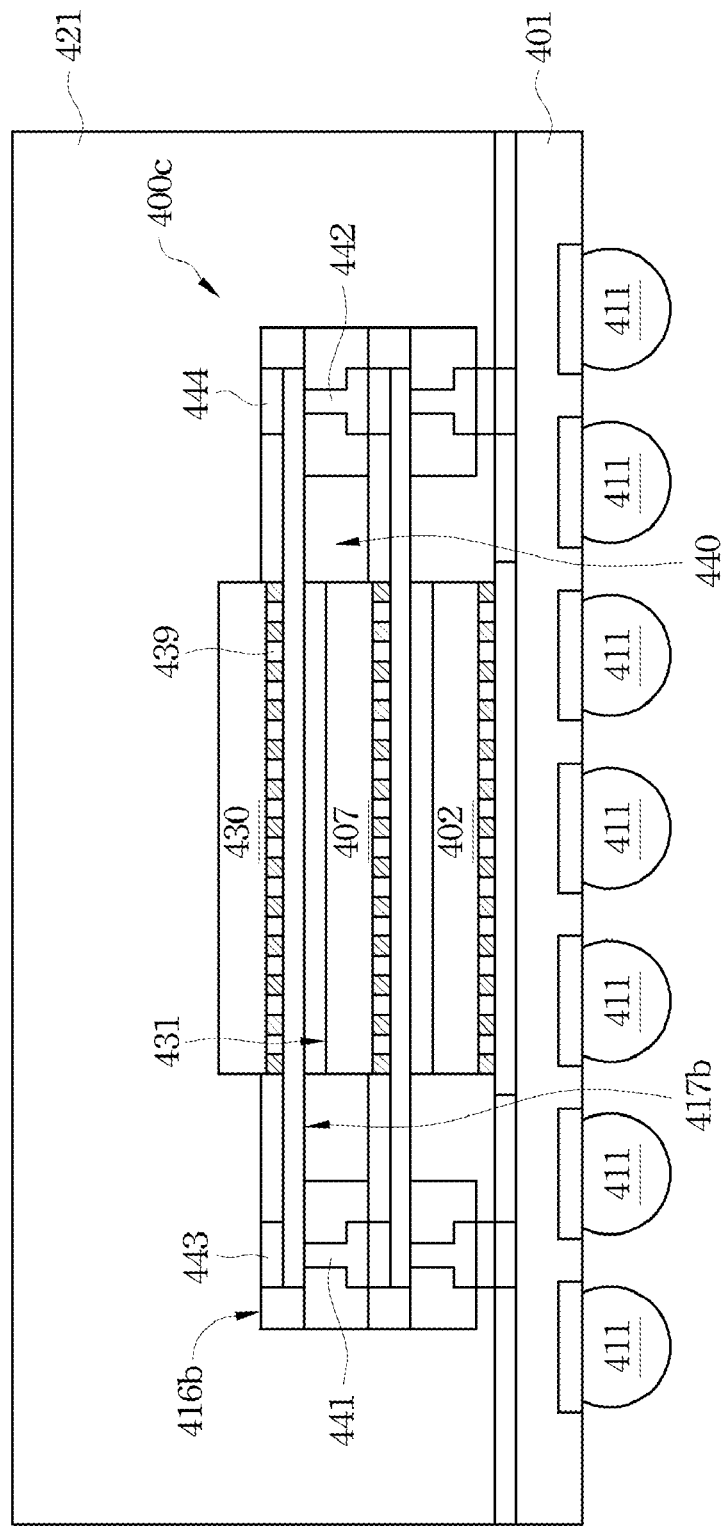
FIG. 5 illustrates a cross section view of a chip-stacked package structure 500 in accordance with a fifth preferred embodiment of the present invention.

Referring to FIG. 5, FIG. 5 illustrates a chip-stacked package structure 500 according to a fifth embodiment of the present invention. The chip-stacked package structure 500 is similar to the chip-stacked package structure 400, except that the chip-stacked package structure 500 further includes a second baseboard substrate 400c. The second baseboard substrate 400c has a structure identical to the structure of first baseboard substrate 400b. There is no further statement here. However, a package structure with four or more chips should also fall within the scope and spirit of the embodiments of the present invention.

Although FIG. 5 is shown and described as having certain numbers and types of elements, such as patterned circuit layers, via plugs or bonding pads, exemplary embodiments are not so limited; that is, other embodiments may include elements other than the ones shown, and may also include different numbers of the elements than are shown. The person skilled in the art should be assumed to know that the patterned circuit layer 438 has a plurality of circuits (not shown) and electrical connection terminals (not shown).

Referring to FIG. 6A-6E, FIG. 6A-6E illustrates a process for manufacturing a chip-stacked package structure 500 according to the fifth embodiment of the present invention.

Figure 6A:
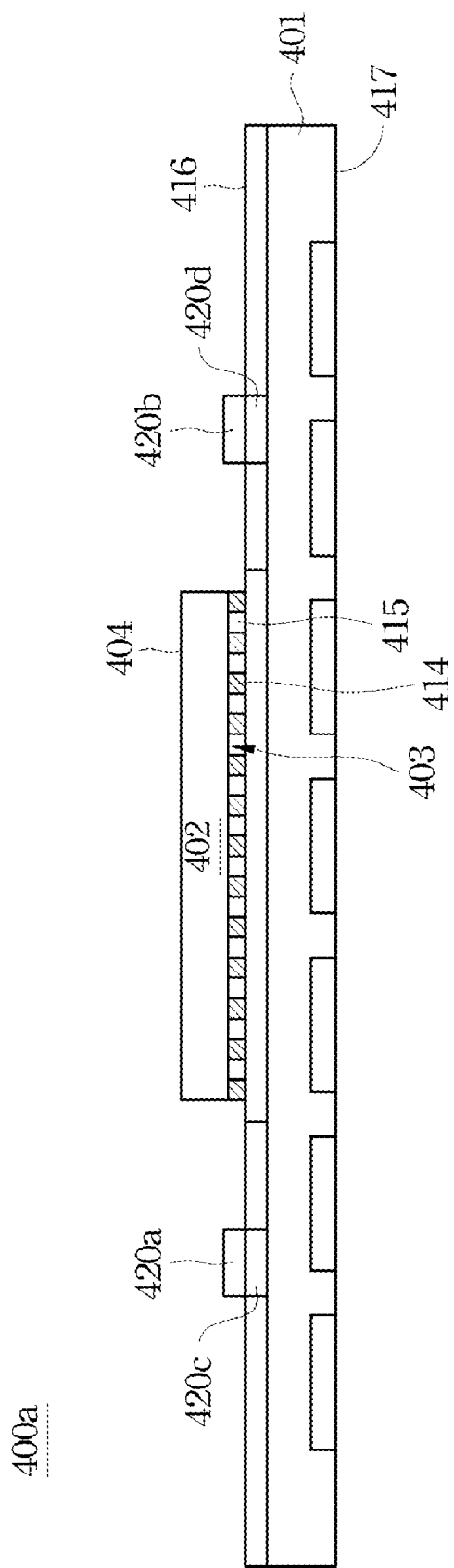
FIG. 6A-6E illustrates the manufacturing process of the chip-stacked package structure 500 in accordance with a fifth embodiment of the present invention.

Referring to FIG. 6A, at first, a main substrate 400a is provided. The main substrate 400a includes a substrate 401, and a first chip 402, as has been discussed above. Therefore, there is no further statement here.

Figure 6B:
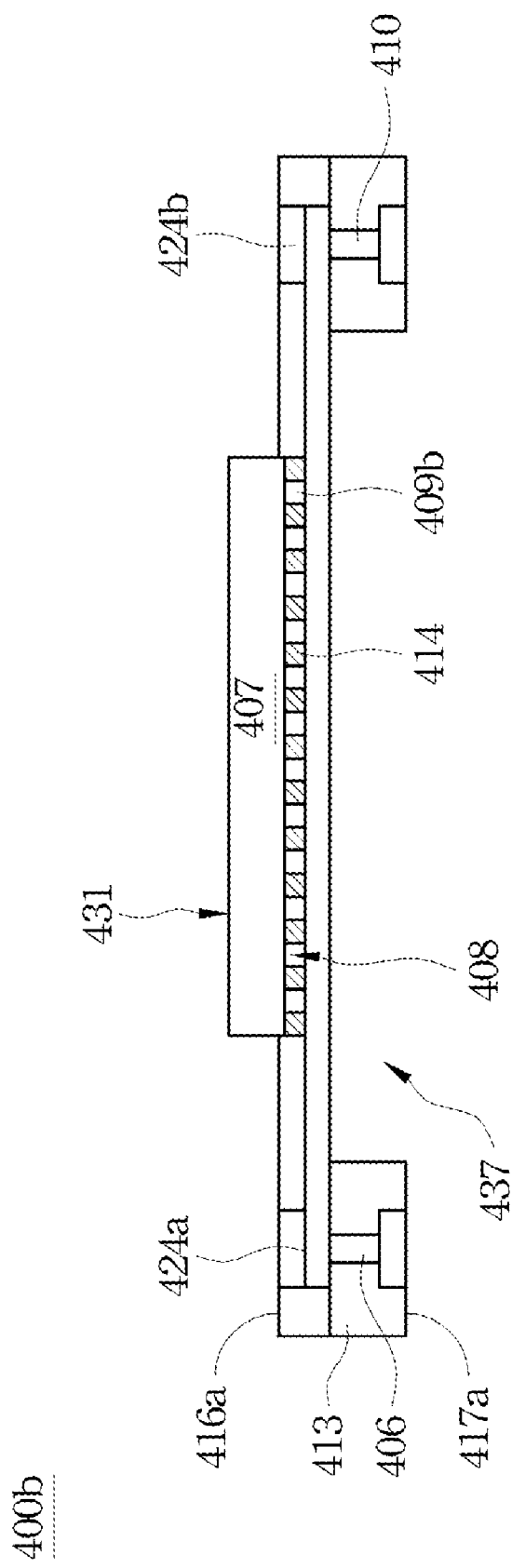

Referring to FIG. 6B, a first baseboard substrate 400b is provided. The first baseboard substrate 400b includes a first core layer 413, a first patterned circuit layer 405 a first solder mask 422, a first via plug 406, a second via plug 410, and a second chip 407 as has been discussed above. Therefore, there is also no further statement here.

Figure 6C:
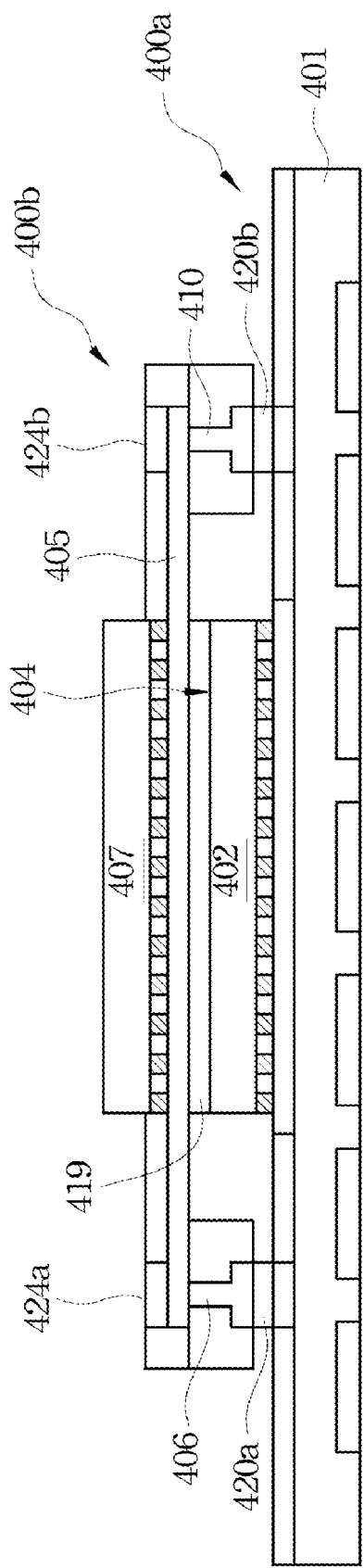

Referring to FIG. 6C, the first via plug 406 and the second via plug 410 are then aligned with the first solder 420a and the second solder 420b. For combining the main substrate 400a and the first baseboard substrate 400b, an adhesive 419 is applying between the first patterned circuit layer 405 of the first baseboard 423 and the first rear surface 404 of the first chip 402. As a result, the first patterned circuit layer 405 is electrically connected to the substrate 401 via the first via plug 406, the second via plug 410, the first solder 420a and the second solder 420b.

Figure 6D:
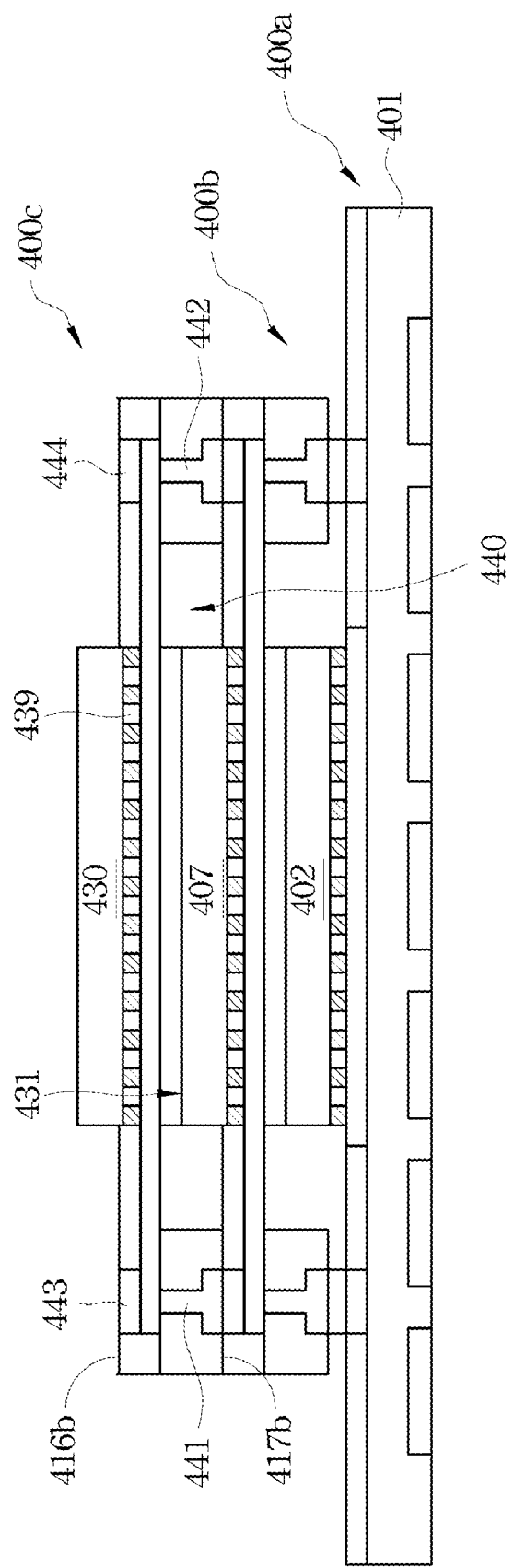

Referring to FIG. 6D, a second baseboard substrate 400c is further stacked on the first baseboard substrate 400b using a process as has been discussed above to manufacture a package structure with three chips. The structure of the second baseboard substrate 400c is identical to the structure of first baseboard substrate 400b.

Figure 6E:
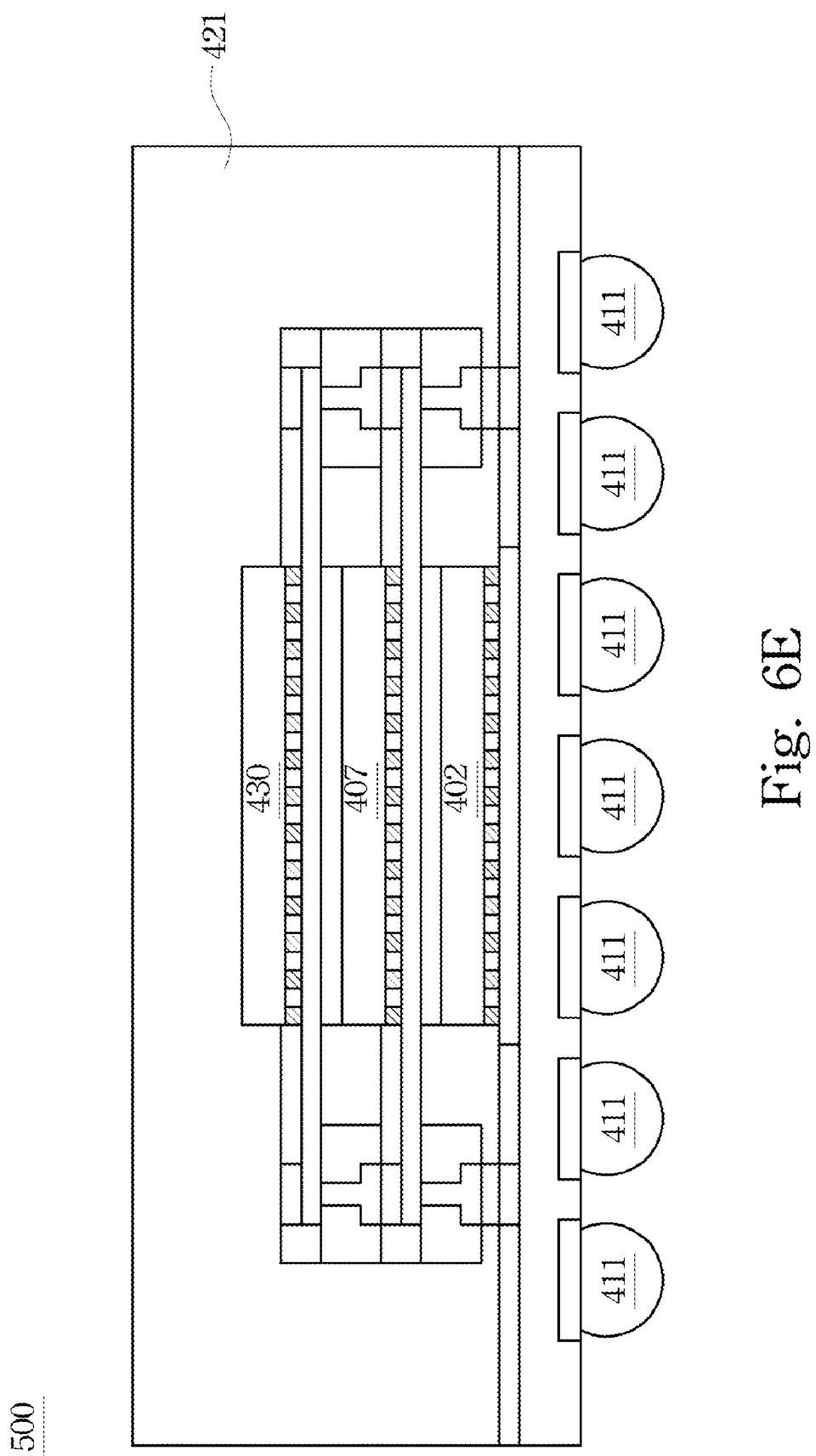
Figure 7:
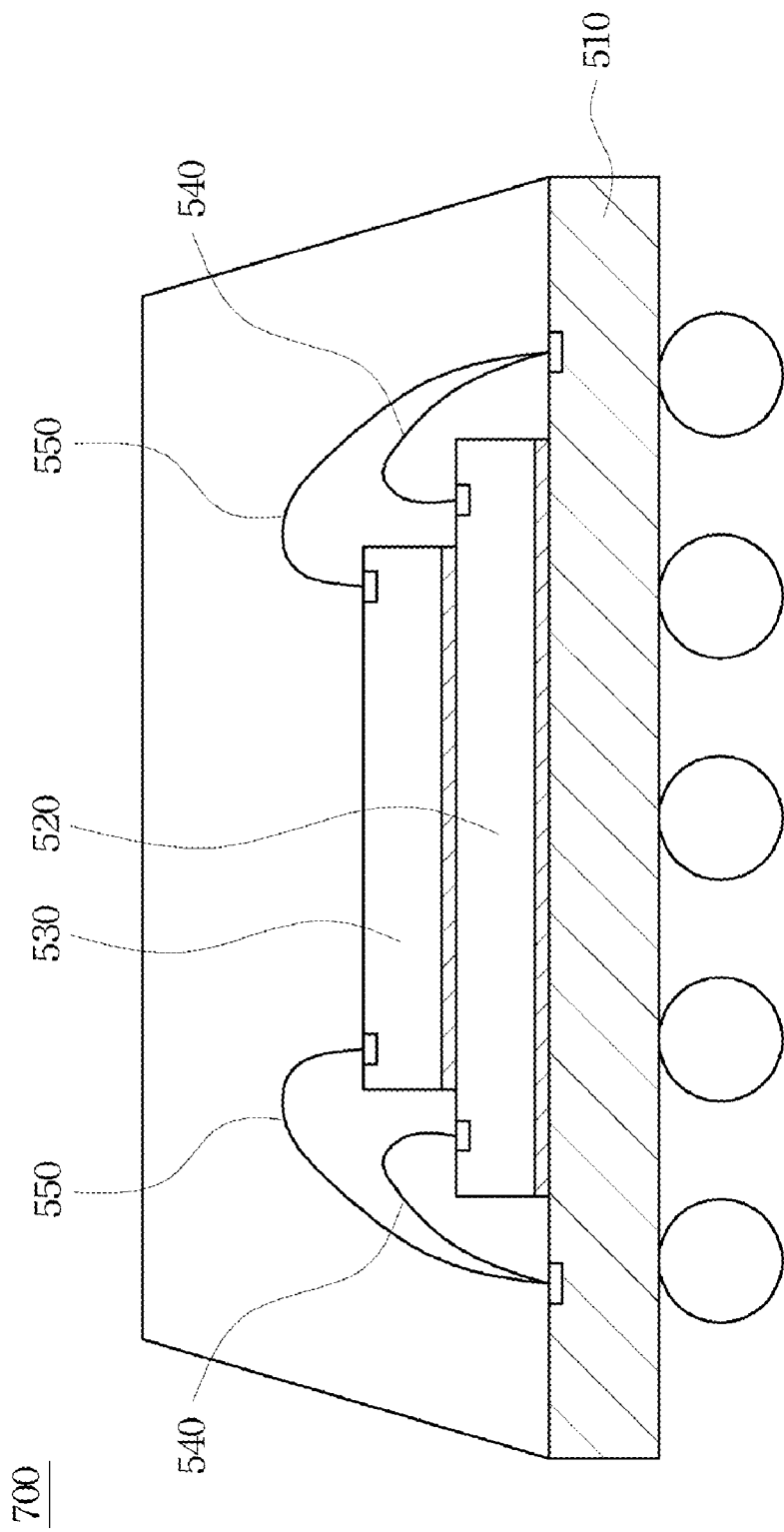
FIG. 7 illustrates a cross section view of a conventional chip stacked structure 700.
Figure 8:
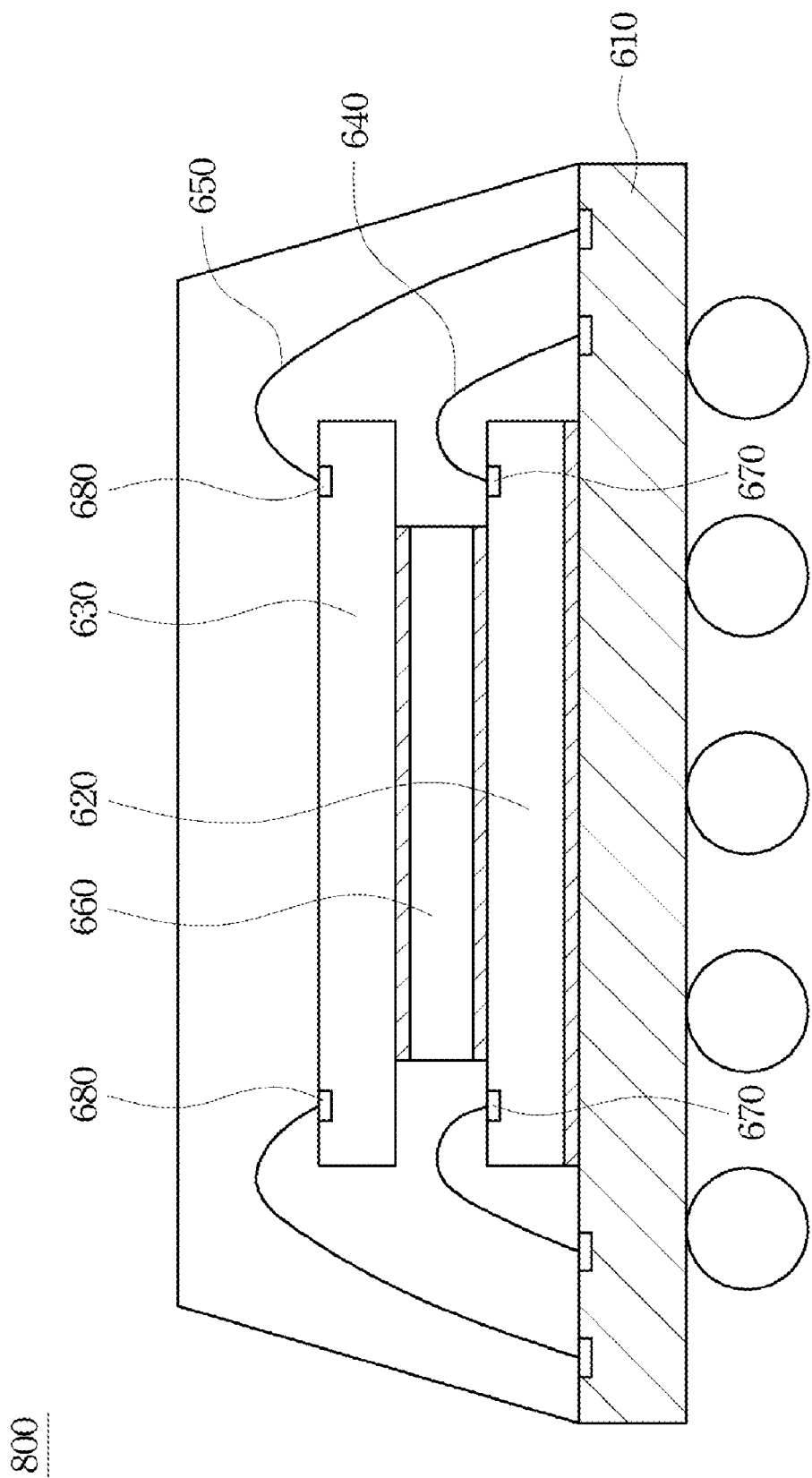
FIG. 8 illustrates a cross view cross-section view of an alternative conventional chip stacked structure 800.

Referring to FIG. 6E, the molding compound 421 is then used to encapsulate the substrate 401, the first chip 402, the first baseboard 423, the second chip 407, the second baseboard 436 and the third chip 430. A plurality of terminals, such as a plurality of solder bumps 411, are then formed on the second surface 417 of the substrate 101 used to electrically connect the substrate 401 with at least one external electronic device (not shown).

In one embodiment, the molding compound 421 can be used to encapsulate the structure having the first baseboard substrate 400b stacked on the main substrate 400a to manufacture a two-chips package structure. However, a method to manufacture a package structure with four or more chips should also fall within the scope and spirit of the embodiments of the present invention.

It is noted that the via plugs are used to substitute the bonding wires for electrically connecting the chips to the substrate in the chip-stacked package structure, thereby shortening the distance between the first chip and the second chip, i.e. the thickness of the chip-stacked package structure can be greatly reduced. By means of stacking the chips on the substrate with via plug instead of bonding wires, the embodiments of the present invention have the advantage of enhancing the heat radiation, improving the electrical connection between the substrate and the chips, and reducing the whole volume of the chip-stacked package structure.

In accordance with above descriptions, the features of the present invention are providing a patterned circuit layer disposed on a rear surface of a lower chip in a chip-stacked package structure, wherein the patterned circuit layer has at least one finger (or through hole) electrically connected to at least one bonding pad (or solder) disposed on the upper chip that is stacked thereon. Accordingly, it is not necessary to extend the length and the radian of the bonding wire in connecting the upper chips with the substrate or to reduce the size of the upper chip for involving more chips in a single package, so as to solve the prior problems in the art. Also, since the lengths of wires are reduced, the disadvantage of wire sweep also can be improved.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A chip-stacked package structure, comprising:
    a main substrate comprising:
        a substrate having a first surface and a second surface opposite to the first surface; and
        a first chip disposed on the first surface, the first chip having a first active surface, a first rear surface, wherein the first active surface faces towards the first surface of the substrate, and the first chip is electrically connected to the substrate;
    a baseboard substrate having a third surface and a fourth surface, the fourth surface faces towards the substrate, the baseboard substrate comprising:
        a core layer having a plurality of first through holes and a first accommodation space in which the first chip is received;
        at least one first via plug and at least one second via plug disposed in the first through holes;
        at least one patterned circuit layer disposed onto the core layer and electrically connected to the at least one first via plug and the at least one second via plug, wherein a portion of the at least one patterned circuit layer is exposed by the first accommodation space;
        a solder mask disposed on the at least one patterned circuit layer and having an opening to expose another portion of the at least one patterned circuit layer and a plurality of second through holes thereon; and
        a second chip disposed on the third surface of the baseboard substrate, the second chip having a second active surface, a second rear surface, wherein the second active surface faces towards the third surface of the baseboard substrate, and the second chip is mounted within the opening of the solder mask and electrically connected to the at least one patterned circuit layer; and
    a molding compound encapsulating the main substrate, and the baseboard substrate.

2. The chip-stacked package structure of claim 1, further comprising at least one first bonding pad and at least one second bonding pad formed in the first surface of the substrate.

3. The chip-stacked package structure of claim 2, further comprising at least one first solder, and at least one second solder disposed on the at least one first bonding pad and the at least one second bonding pad, respectively.

4. The chip-stacked package structure of claim 1, further comprising a plurality of first bumps disposed on the first active surface of the first chip, wherein the first chip is electrically connected to the substrate via the first bumps.

5. The chip-stacked package structure of claim 1, further comprising a third bonding pad and a fourth bonding pad disposed in the second through holes of the solder mask and electrically connected to the at least one patterned circuit layer.

6. The chip-stacked package structure of claim 1, further comprising a plurality of second bumps disposed on the second active surface of the second chip, wherein the second chip is electrically connected to the at least one patterned circuit layer via the second bumps.

7. The chip-stacked package structure of claim 1, further comprising a plurality of solder bumps disposed on the second surface of the substrate.

8. The chip-stacked package structure of claim 1, further comprising an adhesive disposed between the at least one patterned circuit layer and the first rear surface of the first chip.

9. The chip-stacked package structure of claim 1, wherein the at least one first via plug and the at least one second via plug are made of an electrically conductive material.

10. The chip-stacked package structure of claim 1, further comprising an underfill material used to seal the first and second bumps.

11. A chip-stacked package structure, comprising:
    a main substrate comprising:
        a substrate having a first surface and a second surface opposite to the first surface; and
        a first chip disposed on the first surface, the first chip having a first active surface, a first rear surface, wherein the first active surface faces towards the first surface of the substrate, and the first chip is electrically connected to the substrate;
    a plurality of baseboard substrates, each of the baseboard substrates comprising:
        a core layer having a plurality of first through holes and a first accommodation space for receiving a chip;
        at least one first via plug and at least one second via plug disposed in the first through holes;
        at least one patterned circuit layer disposed onto the core layer and electrically connected to the at least one first via plug and the at least one second via plug, wherein a portion of the at least one patterned circuit layer is exposed by the first accommodation space;
        a solder mask disposed on the at least one patterned circuit layer and having an opening to expose another portion of the at least one patterned circuit layer and a plurality of second through holes thereon; and
        a second chip disposed on a third surface of the baseboard substrate, the second chip having a second active surface, a second rear surface, and, wherein the second active surface faces towards the third surface of the baseboard substrate, and the second chip is mounted within the opening of the solder mask and electrically connected to the at least one patterned circuit layer,
        wherein the baseboard substrates are stacked on one another, and electrically connected with one another, and the first accommodation space of a lowest one of the baseboard substrate is used to receive the first chip; and
    a molding compound encapsulating the main substrate and the baseboard substrates.

12. The chip-stacked package structure of claim 11, further comprising at least one first bonding pad and at least one second bonding pad formed in the first surface of the substrate.

13. The chip-stacked package structure of claim 12, further comprising at least one first solder, and at least one second solder disposed on the at least one first bonding pad and the at least one second bonding pad, respectively.

14. The chip-stacked package structure of claim 11, further comprising a plurality of first bumps disposed on the first active surface of the first chip, wherein the first chip is electrically connected to the substrate via the first bumps.

15. The chip-stacked package structure of claim 11, further comprising a third bonding pad and a fourth bonding pad disposed in the second through holes of the solder mask and electrically connected to the at least one patterned circuit layer.

16. The chip-stacked package structure of claim 11, further comprising a plurality of second bumps disposed on the second active surface of the second chip, wherein the second chip is electrically connected to the at least one patterned circuit layer via the second bumps.

17. The chip-stacked package structure of claim 11, further comprising a plurality of solder bumps disposed on the second surface of the substrate.

18. The chip-stacked package structure of claim 11, further comprising an adhesive disposed between the at least one patterned circuit layer of the lowest one of the baseboard substrates and the first rear surface of the first chip.

19. The chip-stacked package structure of claim 11, further comprising an adhesive disposed between the second rear surface of the second chip of the lower one of the baseboard substrate and the at least one first patterned circuit layer of the upper one of the baseboard substrates.

20. The chip-stacked package structure of claim 11, wherein the at least one first via plug and the at least one second via plug are made of an electrically conductive material.

21. The chip-stacked package structure of claim 11, further comprising an underfill material used to seal the first and second bumps.

22. A method for manufacturing a chip-stacked package structure, the method comprising:
providing a main substrate comprising:
a substrate having a first surface and a second surface opposite to the first surface, the substrate having at least one first bonding pad with at least one first solder thereon and at least one second bonding pad with at least one second solder thereon; and
a first chip disposed on the first surface, the first chip having a first active surface, a first rear surface, wherein the first active surface faces towards the first surface of the substrate, and the first chip is electrically connected to the substrate;
providing a baseboard substrate having a third surface and a fourth surface, the baseboard substrate comprising:
a core layer having a plurality of first through holes and a first accommodation space in which the first chip is received;
at least one first via plug and at least one second via plug disposed in the first through holes;
at least one patterned circuit layer disposed onto the core layer and electrically connected to the at least one first via plug and the at least one second via plug, wherein a portion of the at least one patterned circuit layer is exposed by the first accommodation space;
a solder mask disposed on the at least one patterned circuit layer and having an opening to expose another portion of the at least one patterned circuit layer and a plurality of second through holes thereon; and
a second chip disposed on the third surface of the baseboard substrate, the second chip having a second active surface, a second rear surface, wherein the second active surface faces towards the third surface of the baseboard substrate, and the second chip is mounted within the opening of the first solder mask and electrically connected to the at least one patterned circuit layer;
aligning the at least one first via plug and the at least one second via plug with the at least one first solder and the at least one second solder respectively;
applying an adhesive layer between the first rear surface for adhering the baseboard substrate to the main substrate; and
using a molding compound to encapsulate the main substrate and the baseboard substrate.

23. The method of claim 22, wherein the step of providing the main substrate further comprises:
providing a plurality of solder bumps disposed on the second surface of the substrate.

24. The method of claim 22, wherein the step of providing the main substrate further comprises:
providing a plurality of first bumps to electrically connect the first chip and the substrate.

25. The method of claim 24, further comprising utilizing an underfill material to seal the first bumps.

26. The method of claim 22, wherein the step of providing the baseboard substrate further comprises:
providing a plurality of second bumps to electrically connect the second chip and the at least one patterned circuit layer.

27. The method of claim 26, further comprising utilizing an underfill material to seal the second bumps.

28. The method of claim 22, wherein before the step of using the molding compound to encapsulate main substrate and the baseboard substrate, further comprising providing additional baseboard substrates, wherein the additional baseboard substrates are stacked on one another, and electrically connected with one another, and the first accommodation space of a lowest one of the additional baseboard substrates is used to receive the first chip of the main substrate.

* * * * *